(12) United States Patent
Yagiura

(10) Patent No.: US 8,158,454 B2
(45) Date of Patent: Apr. 17, 2012

(54) METHOD FOR MANUFACTURING SOLAR CELL MODULE

(75) Inventor: Toshio Yagiura, Kobe (JP)

(73) Assignee: Sanyo Electric Co., Ltd., Osaka (JP)

( * ) Notice: Subject to any disclaimer, the term of this patent is extended or adjusted under 35 U.S.C. 154(b) by 3 days.

(21) Appl. No.: 12/740,092

(22) PCT Filed: Sep. 9, 2009

(86) PCT No.: PCT/JP2009/065730
§ 371 (c)(1),
(2), (4) Date: May 25, 2010

(87) PCT Pub. No.: WO2010/029939
PCT Pub. Date: Mar. 18, 2010

(65) Prior Publication Data
US 2010/0255631 A1    Oct. 7, 2010

(30) Foreign Application Priority Data

Sep. 9, 2008 (JP) ................................. 2008-231321

(51) Int. Cl.
*H01L 21/00* (2006.01)
(52) U.S. Cl. .................................. 438/88; 257/E31.11
(58) Field of Classification Search ............ 438/88; 257/E31.11
See application file for complete search history.

(56) References Cited

U.S. PATENT DOCUMENTS

| | | | |
|---|---|---|---|
| 4,166,918 A | 9/1979 | Nostrand et al. | |
| 4,464,823 A | 8/1984 | Izu et al. | |
| 2004/0058602 A1* | 3/2004 | Maynard | 442/76 |
| 2005/0076945 A1* | 4/2005 | Tachibana et al. | 136/244 |
| 2005/0200363 A1* | 9/2005 | Hasegawa et al. | 324/523 |

FOREIGN PATENT DOCUMENTS

| | | |
|---|---|---|
| JP | 60-46080 A | 3/1985 |
| JP | 63-41081 A | 2/1988 |
| JP | 10-4202 A | 1/1998 |
| JP | 2001-135835 A | 5/2001 |
| WO | WO 2010/029939 A1 | 3/2010 |

OTHER PUBLICATIONS

International Search Report for PCT/JP2009/065730, dated Oct. 20, 2009, pp. 1-5.

* cited by examiner

*Primary Examiner* — Zandra Smith
*Assistant Examiner* — Igwe U Anya
(74) *Attorney, Agent, or Firm* — Ditthavong Mori & Steiner, P.C.

(57) ABSTRACT

A method for manufacturing a solar cell module 10 comprises the steps of exposing a part of the metal electrode layer 4 in a pinhole $PH_{ii}'$ which is formed in the resin layer 5 by applying a reverse voltage across the transparent electrode layer 2 and the metal electrode layer 4 in the reverse voltage repair process and removing the part of the metal electrode layer 4 by etching the part of the metal electrode layer 4 using the resin layer 5 as a mask.

3 Claims, 9 Drawing Sheets (a)

(b)

(c)

(d)

(a)

(b)

(c)

(d)

METHOD FOR MANUFACTURING SOLAR CELL MODULE

CROSS-REFERENCE TO RELATED APPLICATION

The present application is a national phase application of PCT Application No. PCT/2009/065730, filed on Sep. 9, 2009, and claims priority to Japanese Application No. JP 2008-231321, filed on Sep. 9, 2008, the entire contents of which are herein incorporated by reference.

TECHNICAL FIELD

The present invention relates to a method for manufacturing a solar cell module, the method including a reverse voltage repair process.

BACKGROUND ART

In general, a thin-film solar cell module includes a transparent electrode, a semiconductor layer, and a metal electrode which are sequentially formed on a transparent substrate.

For example, when a semiconductor layer is formed on a transparent electrode by the CVD method, a foreign material attached onto the transparent electrode may be incorporated into the semiconductor layer, in some cases. When a pinhole is formed by separating such a foreign material from the semiconductor layer, and is filled with a material of a metal electrode, a short circuit occurs between the transparent electrode and the metal electrode. This results in a problem that the output of the solar cell module is reduced.

Then, a technique is proposed in which a material of a metal electrode filled into a pinhole is vaporized by application of a voltage (hereinafter referred to as a "reverse voltage") in a direction opposite to the direction of a photo-electromotive force to be generated in a semiconductor layer (refer to, for example, Patent Document 1). The step of applying a reverse voltage is generally called a "reverse voltage repair process".

PRIOR ART DOCUMENT

Patent Document

Patent Document 1: Application publication No. S60-46080

SUMMARY OF THE INVENTION

However, it is difficult to remove a microscopic short circuit between a transparent electrode and a metal electrode by the technique described in Patent Document 1. Specifically, a microscopic short circuit occurs when the resistance of a semiconductor layer is partially lowered, or when a minute pinhole is formed because of contamination with a small foreign material. Even when a reverse voltage is applied to a portion at which such a microscopic short circuit occurs, a material of a metal electrode is not heated to a high temperature enough to vaporize the material. For this reason, the microscopic short circuit cannot be removed.

The present invention was made in view of the above-described circumstances, and an object of the present invention is to provide a method for manufacturing a solar cell module, the method being capable of suppressing the occurrence of a microscopic short circuit between a transparent electrode and a metal electrode.

The method for manufacturing a solar cell module according to the aspect of the present invention, is summarized as comprising the steps of: sequentially forming a transparent electrode layer, a semiconductor layer, and a metal electrode layer on a main surface of a transparent substrate; forming a resin layer on the metal electrode layer; exposing a part of the metal electrode layer in a pinhole which is formed in the resin layer by applying a voltage across the transparent electrode layer and the metal electrode layer in a direction opposite to a direction of a photo-electromotive force to be generated in the semiconductor layer; and removing the part of the metal electrode layer by etching the part of the metal electrode layer using the resin layer as a mask.

In the method for manufacturing a solar cell module according to the aspect of the present invention, even when a short circuit occurring between the transparent electrode layer and the metal electrode layer is microscopic, and hence the metal electrode layer cannot be vaporized, a part of the resin layer is removed by being vaporized to form the pinhole in the resin layer. As a result, a part of the metal electrode layer at which the microscopic short circuit occurs can be exposed in the pinhole. The exposed metal electrode layer, that is, the part of the metal electrode layer at which the microscopic short circuit occurs is removed by etching. Thereby, the occurrence of a microscopic short circuit between the transparent electrode and the metal electrode can be suppressed.

The method for manufacturing a solar cell module according to the aspect of the present invention, is summarized as comprising the steps of: sequentially forming a transparent electrode layer, a semiconductor layer, and a metal electrode layer on a main surface of a transparent substrate; forming a first pinhole in the metal electrode layer by applying a voltage across the transparent electrode layer and the metal electrode layer in a direction opposite to a direction of a photo-electromotive force to be generated in the semiconductor layer; forming a resin layer on the metal electrode layer and in the first pinhole; exposing a part of the metal electrode layer in a second pinhole which is formed in the resin layer by applying the reverse voltage across the transparent electrode layer and the metal electrode layer; and removing the part of the metal electrode layer by etching the part of the metal electrode layer using the resin layer as a mask.

In the aspect of the present invention, the semiconductor layer may have a first semiconductor layer, a transparent electrically conductive layer, and a second semiconductor layer which are sequentially formed on the transparent electrode, and in the step of forming the first pinhole, the first pinhole penetrates through at least the metal electrode layer and the second semiconductor layer.

According to the present invention, it is possible to provide a method for manufacturing a solar cell module, the method being capable of suppressing the occurrence of a microscopic short circuit between a transparent electrode and a metal electrode.

BEST MODES FOR CARRYING OUT THE INVENTION

Embodiments of the present invention will be described with reference to the drawings. In the following description of the drawings, same or similar reference signs denote same or similar elements and portions. It should be noted that the drawings are schematic and ratios of dimensions and the like are different from actual ones. Therefore, specific dimensions and the like should be determined in consideration of the following description. As a matter of course, the drawings also include portions having different dimensional relationships and ratios from each other.

First Embodiment (Structure of Solar Cell Module)

Figure 1:
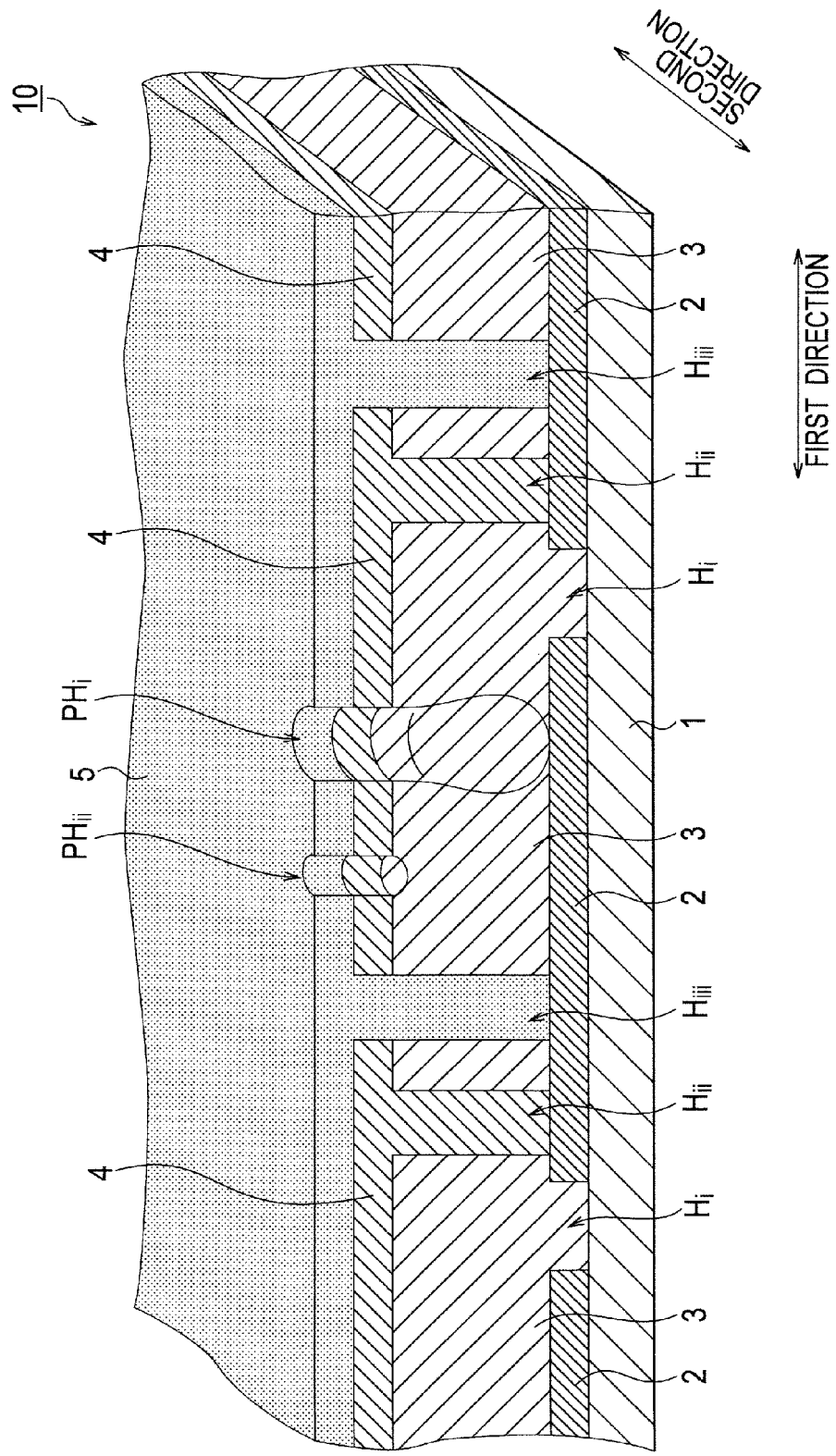
FIG. 1 is a cross-sectional view of a solar cell module 10 according to a first embodiment of the present invention.

Hereinafter, a structure of a solar cell module according to a first embodiment of the present invention will be described with reference to FIG. 1. FIG. 1 is an enlarged cross-sectional view of a solar cell module 10 according to the first embodiment.

As shown in FIG. 1, the solar cell module 10 includes a transparent substrate 1, a transparent electrode layer 2, a semiconductor layer 3, a metal electrode layer 4, and a resin layer 5. The transparent electrode layer 2, the semiconductor layer 3, the metal electrode layer 4, and the resin layer 5 are sequentially formed on a main surface of the transparent substrate 1. A current generated in the semiconductor layer 3 flows inside the solar cell module 10 in a first direction.

The transparent substrate 1 is a single substrate of the solar cell module 10. Transparent glass, plastics or the like can be used for the transparent substrate 1.

The transparent electrode layer 2 is stacked on the main surface of the transparent substrate 1. The transparent electrode layer 2 is formed of a metal oxide having electrical conductivity and transparency. For the transparent electrode layer 2, for example, indium oxide ($In_2O_3$), zinc oxide (ZnO), titanium oxide ($TiO_2$), tin oxide ($SnO_2$), or the like can be used. The transparent electrode layer 2 may be doped with fluorine (F), tin (Sn), aluminum (Al), iron (Fe), gallium (Ga), niobium (Nb), or the like.

The transparent electrode layer 2 is divided on the transparent substrate 1 by first separation grooves $H_i$, as shown in FIG. 1. The first separation grooves $H_i$ are formed so as to extend in a second direction substantially perpendicular to the first direction. Bottom surfaces of the first separation grooves $H_i$ are formed by the transparent substrate 1.

The semiconductor layer 3 is stacked on the transparent electrode layer 2. The semiconductor layer 3 has a pin junction (not shown) formed by stacking a p-type semiconductor layer, an i-type semiconductor layer, which is a power generation layer, and an n-type semiconductor layer, from a side of the transparent substrate 1. Accordingly, a photo-generated current generated in the semiconductor layer 3 flows inside the semiconductor layer 3 from the transparent electrode layer 2 to the metal electrode layer 4. For the semiconductor layer 3, for example, a silicon-based semiconductor material such as amorphous silicon or microcrystalline silicon can be used.

The semiconductor layer 3 is formed also in the first separation grooves $H_i$ as shown in FIG. 1.

The semiconductor layer 3 is divided on the transparent electrode layer 2 by second separation grooves $H_{ii}$, as shown in FIG. 1. The second separation grooves $H_{ii}$ are formed so as to extend in the second direction. Bottom surfaces of the second separation grooves $H_{ii}$ are formed by the transparent electrode layer 2.

The metal electrode layer 4 is stacked on the semiconductor layer 3. For the metal electrode layer 4, for example, an electrically conductive metal material such as silver (Ag) can be used.

The metal electrode layer 4 is formed also in the second separation groove $H_{ii}$, as shown in FIG. 1.

Each of the semiconductor layer 3 and the metal electrode layer 4 is divided on the transparent electrode layer 2 by third separation grooves $H_{iii}$. The third separation grooves $H_{iii}$ are formed so as to extend in the second direction. Bottom surfaces of the third separation grooves $H_{iii}$ are formed by the transparent electrode layer 2.

The resin layer 5 is stacked on the metal electrode layer 4. The resin layer 5 is formed of an insulating resin material. For the resin layer 5, for example, acrylic (PMMA), polycarbonate (PC), polyethylene (PE), polyethylene terephthalate (PET), polyvinyl chloride (PVC), a polyester (ABS), epoxy (EP), or the like can be used. The resin layer 5 is preferably a material which vaporizes at low temperature than the temperature at which the metal electrode layer 4 vaporizes by heating.

The resin layer 5 is formed also in the third separation grooves $H_{iii}$, as shown in FIG. 1.

In this embodiment, the solar cell module 10 has a first pinhole $PH_i$ and a second pinhole $PH_{ii}$, as shown in FIG. 1.

The first pinhole $PH_i$ penetrates through the semiconductor layer 3, the metal electrode layer 4, and the resin layer 5. The second pinhole $PH_{ii}$ penetrates through the metal electrode layer 4 and the resin layer 5. Description as to how the first pinhole $PH_i$ and the second pinhole $PH_{ii}$ are formed will be made below.

Figure 2:
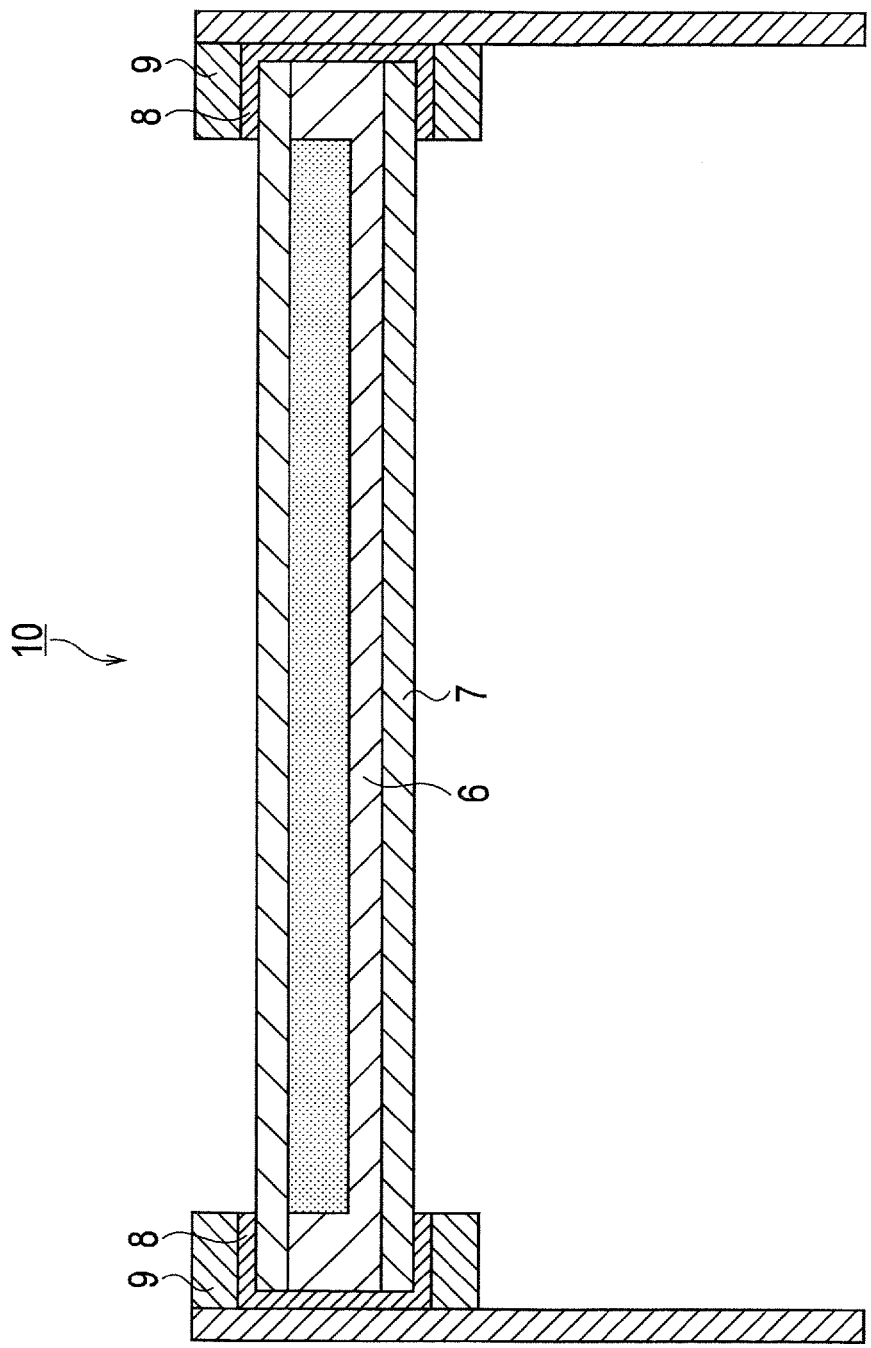
FIG. 2 is an outline view of the solar cell module 10 according to the first embodiment of the present invention.

The solar cell module 10 having the above-described structure may be formed into a sealed structure by being sealed with a sealing member 6 and a back-surface-side protection member 7, as shown in FIG. 2. In this case, the first pinhole $PH_i$ and the second pinhole $PH_{ii}$ are filled with the sealing member 6.

For the sealing member 6, a resin such as EVA, EEA, PVB, silicone, urethane, acrylic, or epoxy can be used. For the back-surface-side protection member 7, a resin film of PET or the like, a laminated film having a structure in which Al foil is sandwiched between resin films or the like can be used.

The sealed structure may be reinforced in a way that an outer peripheral portion thereof is fixed by a elastic member 8 and a frame 9, as shown in FIG. 2. For the elastic member 8, silicone rubber, butyl rubber, or the like can be used. As the frame 9, an Al frame, an iron frame, a SUS frame, or the like can be used.

(Method for Manufacturing Solar Cell Module)

Figure 3:
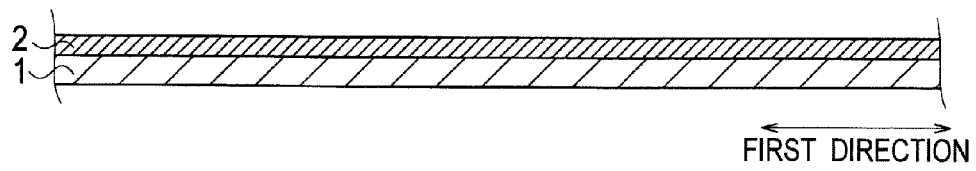
FIG. 3 is a view for describing the manufacturing process of the solar cell module 10 according to the first embodiment of the present invention (part 1).
Figure 3:
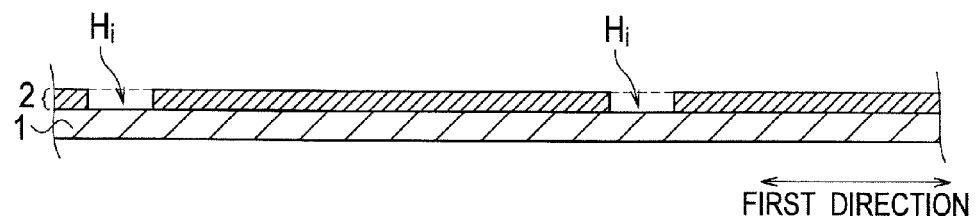
Figure 3:
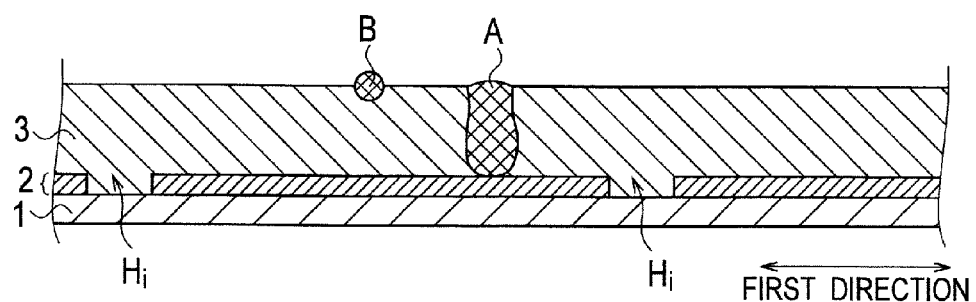
Figure 3:
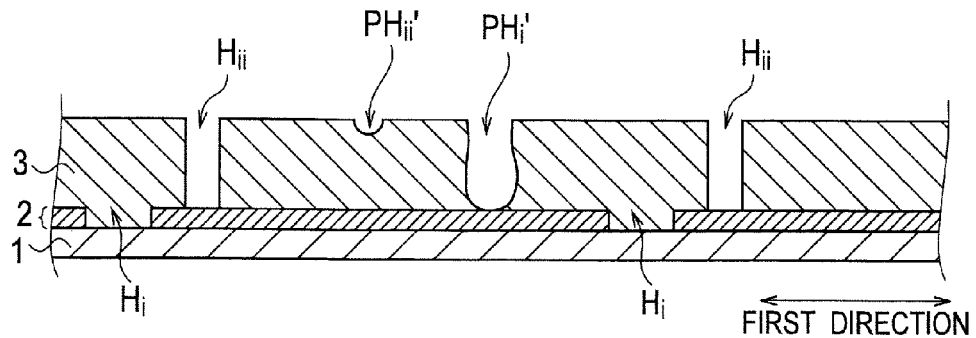
Figure 4:
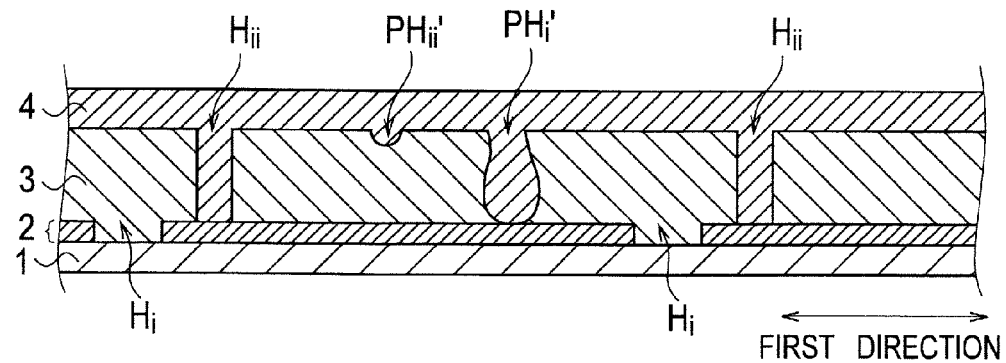
FIG. 4 is a view for describing the manufacturing process of the solar cell module 10 according to the first embodiment of the present invention (part 2).
Figure 4:
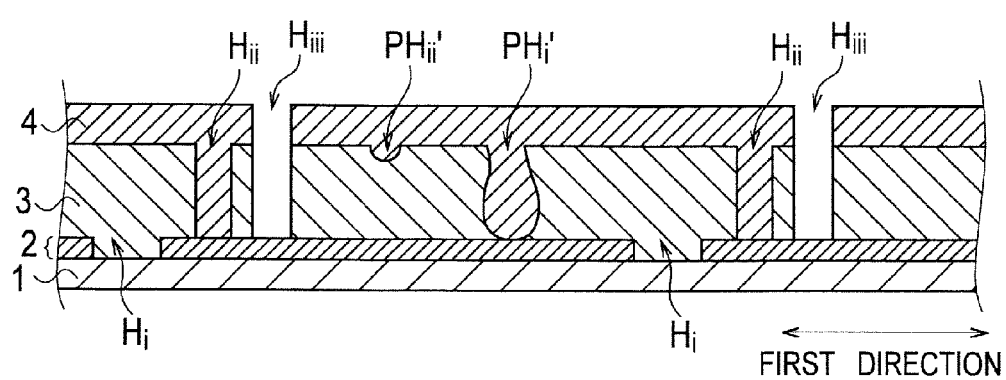
Figure 4:
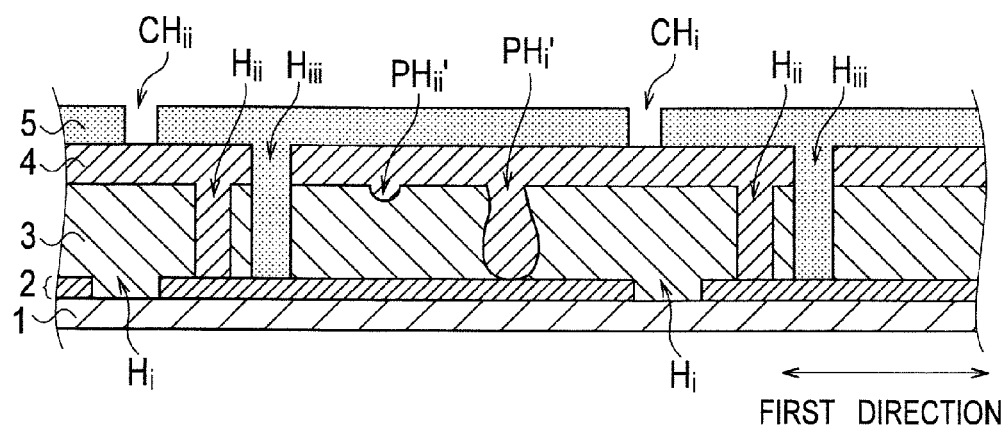
Figure 5:
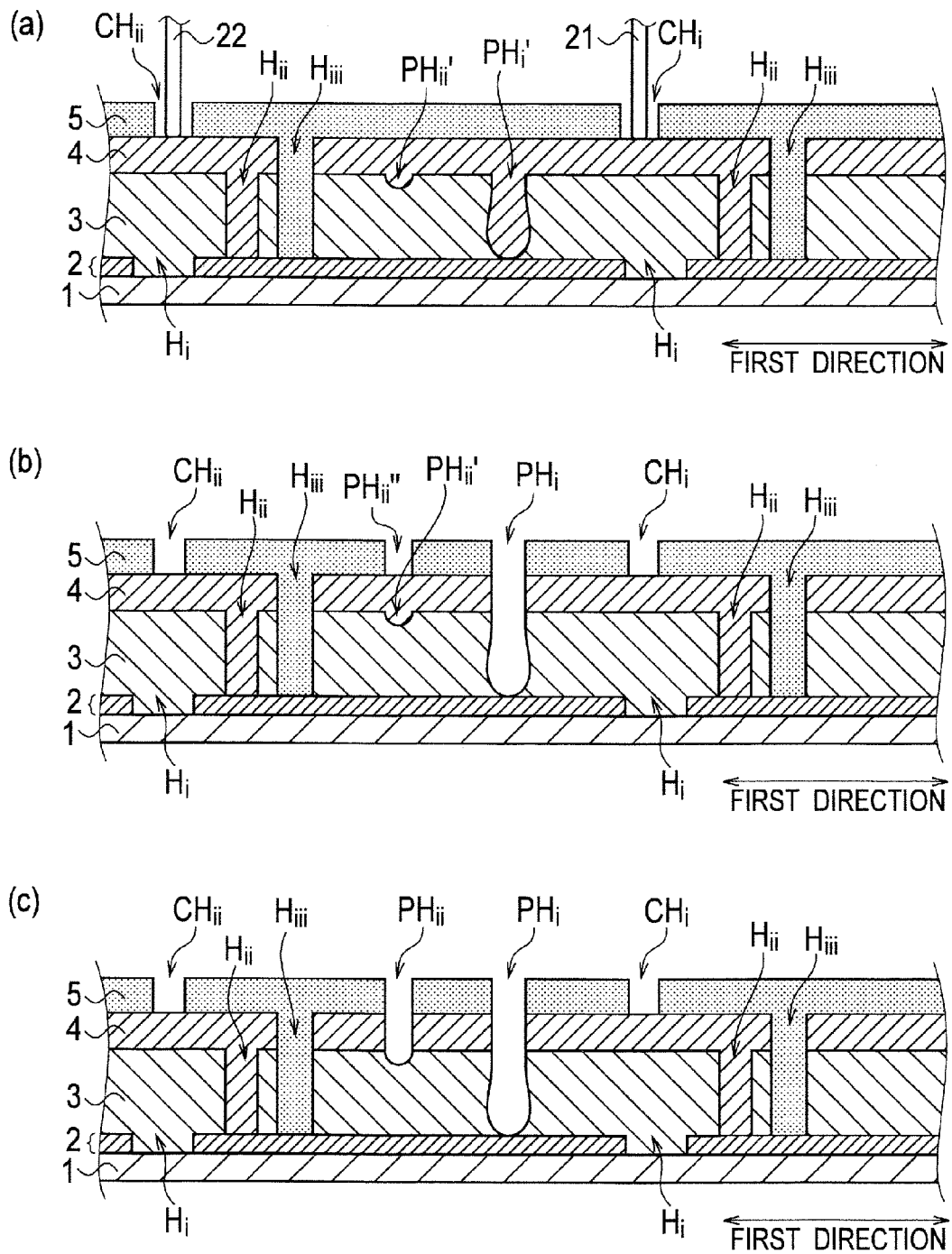
FIG. 5 is a view for describing the manufacturing process of the solar cell module 10 according to the first embodiment of the present invention (part 3).

Description will be made of a method for manufacturing the solar cell module 10 according to the first embodiment with reference to FIG. 3 to FIG. 5.

As shown in FIG. 3(a), the transparent electrode layer 2 is stacked on the main surface of the transparent substrate 1. By irradiating the stacked transparent electrode layer 2 with laser light, part of the transparent electrode layer 2 is removed so as to extend in the second direction. This results in the formation of the first separation grooves $H_i$ which divide the transparent electrode layer 2, as shown in FIG. 3(b). The first separation grooves $H_i$ may also be formed by stacking the transparent electrode layer 2 by use of a mask.

Next, by use of a CVD method or the like, a semiconductor layer 3 is formed on the transparent electrode layer 2 and in the first separation grooves $H_i$, as shown in FIG. 3(c). In such a case, when a foreign material A is attached onto the transparent electrode layer 2, the foreign material A is incorporated into the semiconductor layer 3 as shown in FIG. 3(c). Subsequently, the formed semiconductor layer 3 is removed in the second direction by irradiating the semiconductor layer 3 with laser light. This results in the formation of the second separation grooves $H_{ii}$ which divide the semiconductor layer 3 as shown in FIG. 3(d). When the foreign material A incorporated into the semiconductor layer 3 separates from the semiconductor layer 3, a pinhole $PH_i'$ is formed in the semiconductor layer 3.

During the formation of the semiconductor layer 3, a foreign material B may be attached onto the semiconductor layer 3 as shown in FIG. 3(c). When the foreign material B separates from the semiconductor layer 3, a pinhole $PH_{ii}'$ is formed in the semiconductor layer 3.

Next, the metal electrode layer 4 is formed on the semiconductor layer 3 and in the second separation grooves $H_{ii}$ as shown in FIG. 4(a). Specifically, silver or the like is sputtered onto the semiconductor layer 3 and in the second separation grooves $H_{ii}$. In this case, the metal electrode layer 4 is formed also in the pinhole $PH_i'$ and the pinhole $PH_{ii}'$. Subsequently, by irradiating sides which is opposite to the first separation grooves $H_i$ with respect to the second separation grooves $H_{ii}$ with laser light, the semiconductor layer 3 and the metal electrode layer 4 are removed in the second direction. This results in the formation of the third separation grooves $H_{iii}$ which divide both of the semiconductor layer 3 and the metal electrode layer 4 as shown in FIG. 4(b).

Subsequently, the resin layer 5 is formed on the metal electrode layer 4 and in the third separation grooves $H_{iii}$, as shown in FIG. 4(c). Specifically, a resin material dissolved in an organic solvent is coated by a spray method, a spin-coating method, a printing method, or the like. The thickness of the resin layer 5 formed on the metal electrode layer 4 can be set as appropriate in consideration of both easiness of vaporization in a reverse voltage repair process to be described later and etch resistance in a etching step to be described later.

In this embodiment, a first contact hole $CH_i$ and a second contact hole $CH_{ii}$ which penetrate through the resin layer 5 are formed by use of a mask. Specifically, the first contact hole $CH_i$ is formed so that a part of one divided section of the metal electrode layer 4 can be exposed as shown in FIG. 4(c). The second contact hole $CH_{ii}$ is formed so that an adjacent other divided section of the metal electrode layer 4 can be exposed.

Next, the resin layer 5 is heated at approximately 100° C. for about 10 minutes, whereby the resin layer 5 is hardened.

Next, a first electrode 21 is inserted into the first contact hole $CH_i$ as shown in FIG. 5(a). A second electrode 22 is inserted into the second contact hole $CH_{ii}$. A voltage in a direction opposite to a direction of a photo-electromotive force to be generated in the semiconductor layer 3 is applied across the transparent electrode layer 2 and the metal electrode layer 4. Specifically, a high potential is applied to the first electrode 21, and a low potential is applied to the second electrode 22. In this embodiment, this step of applying a reverse voltage is referred to as a "reverse voltage repair process."

In this reverse voltage repair process, the metal electrode layer 4 formed in the pinhole $PH_i'$ and a portion (hereinafter referred to as a "microscopic short circuit portion") at which a microscopic short circuit is caused by the metal electrode layer 4 formed in the pinhole $PH_{ii}'$ are heated.

The heated metal electrode layer 4 formed in the pinhole $PH_i'$ vaporizes. This results in the formation of the first pinhole $PH_i$ which penetrates through the semiconductor layer 3, the metal electrode layer 4, and the resin layer 5.

Meanwhile, the microscopic short circuit portion of the metal electrode layer 4 is more resistant to current flow than the metal electrode layer 4 formed in the pinhole $PH_i'$. The microscopic short circuit portion of the metal electrode layer 4 is less likely to be heated. For this reason, the temperature of the microscopic short circuit portion of the metal electrode layer 4 does not reach a temperature at which the metal electrode layer 4 vaporizes. However, since resins vaporize at lower temperatures than metals, the resin layer 5 formed on the pinhole $PH_{ii}'$ vaporizes. This results in the formation of a pinhole $PH_{ii}''$ above the pinhole $PH_{ii}'$ of the resin layer 5 as shown in FIG. 5(b). A part of the metal electrode layer 4 is exposed in the pinhole $PH_i''$.

Next, as shown in FIG. 5(c), the metal electrode layer 4 exposed in the pinhole $PH_i''$ is removed by etching using the resin layer 5 as a mask. Specifically, the metal electrode layer 4 exposed in the pinhole $PH_{ii}''$ is etched for about 3 minutes with a 5% aqueous solution of hydrochloric acid. This results in the formation of a second pinhole $PH_{ii}$ which penetrates through the metal electrode layer 4 and the resin layer 5.

The solar cell module 10 manufactured as described above is sealed with the sealing member 6 and the back-surface-side protection member 7. The first pinhole $PH_i$ and the second pinhole $PH_{ii}$ are filled with the sealing member 6.

(Operation and Effects)

The method for manufacturing the solar cell module 10 according to the first embodiment of the present invention includes a step of exposing a part of the metal electrode layer 4 in the pinhole $PH_{ii}''$ formed in the resin layer 5 by applying a reverse voltage across the transparent electrode layer 2 and the metal electrode layer 4 and a step of removing a part of the metal electrode layer 4 by performing etching using the resin layer 5 as a mask in the reverse voltage repair process.

Accordingly, a part of the resin layer 5 vaporizes owing to the microscopic short circuit portion of the metal electrode layer 4, and the pinhole $PH_i''$ is formed in the resin layer 5. Specifically, the microscopic short circuit portion of the metal electrode layer 4 can be exposed in the pinhole $PH_{ii}''$. Accordingly, by removing the microscopic short circuit portion of the metal electrode layer 4 by performing etching, the microscopic short circuit between the transparent electrode layer 2 and the metal electrode layer 4 can be removed with a high precision, In the step of etching the microscopic short circuit portion of the metal electrode layer 4, the resin layer 5 in which the pinhole $PH_{ii}''$ is formed can be used as a mask. For this reason, productivity of a solar cell module can be improved.

Note that, in a structure in which a microcrystalline silicon semiconductor layer and a metal electrode are connected, a metal material forming the metal electrode layer 4 may get into microcrystalline silicon grains. In such a case, the microcrystalline silicon semiconductor layer may have a low resistance in same portion, which results in reduction of output of the solar cell module. Moreover, when the semiconductor layer is removed by laser light irradiation, the semiconductor layer may be crystallized in same portion. In such a case, the crystallized semiconductor layer comes to have a low resistance, which may result in reduction of output of the solar cell module. The present invention is preferable for removing the metal electrode layers 4 on such semiconductor layers having low resistance. This removal of such metal electrode layers 4 allows the reduction of output of the solar cell modules to be suppressed.

Second Embodiment (Structure of Solar Cell Module)

Figure 6:
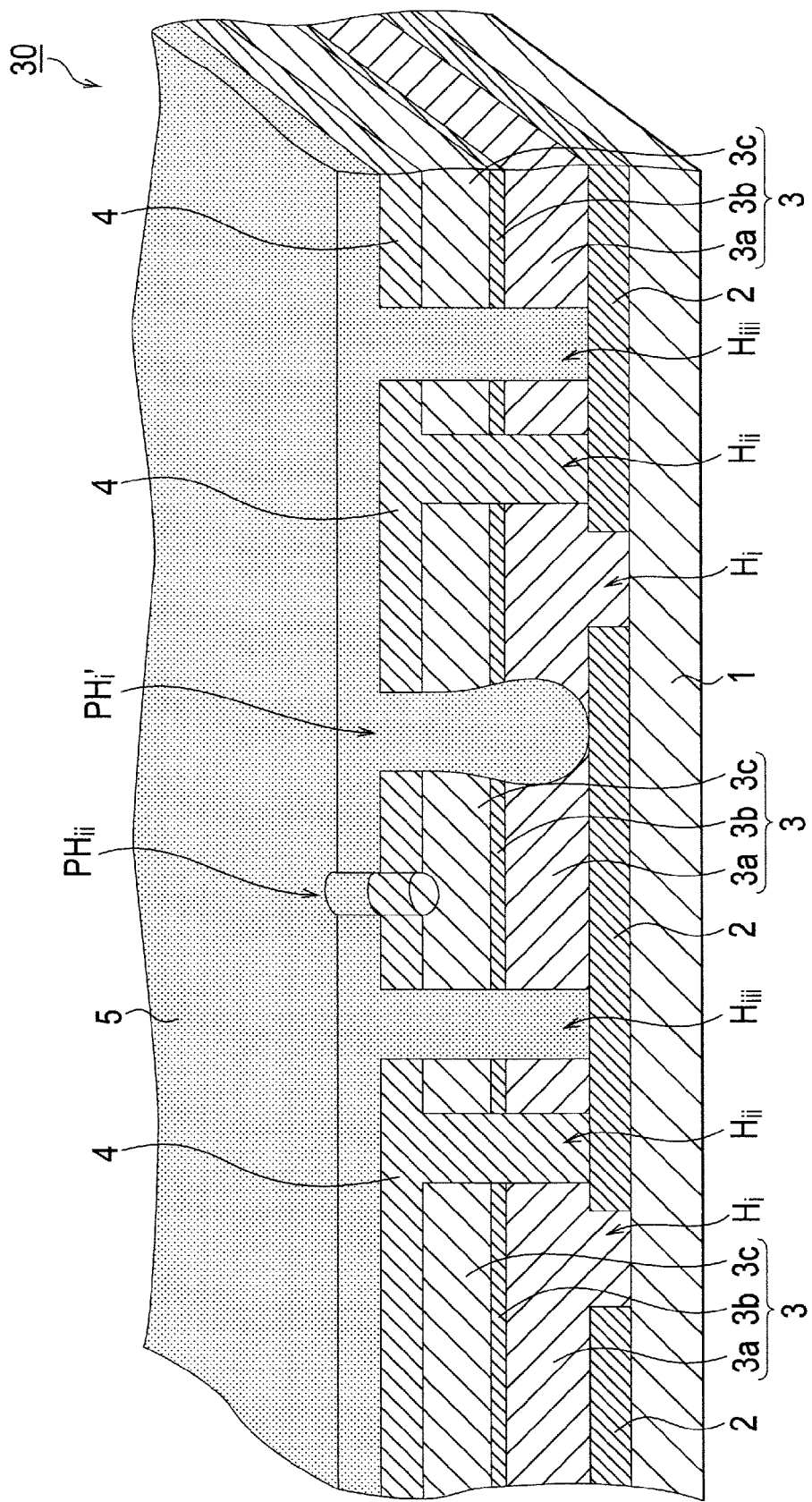
FIG. 6 is a cross-sectional view of a solar cell module 30 according to a second embodiment of the present invention.

Hereinafter, a structure of a solar cell module according to the second embodiment of the present invention will be described with reference to FIG. 6. FIG. 6 is a cross-sectional view of a solar cell module 30 according to the second embodiment. In the following description, different points from the above-described first embodiment are mainly described.

As shown in FIG. 6, a first pinhole $PH_i'$ according to this embodiment is filled with a resin layer 5.

Moreover, a semiconductor layer 3 is formed of a first semiconductor layer 3a, a transparent electrically conductive layer 3b, and a second semiconductor layer 3c, as shown in FIG. 6.

The first semiconductor layer 3a generates photo-generated carriers with the light which is incident from a side of the transparent electrode layer 2. Moreover, the first semiconductor layer 3a generates photo-generated carriers with the light reflected by the transparent electrically conductive layer 3b to be described later. The first semiconductor layer 3a has a pin junction (not shown) which is formed by stacking a p-type semiconductor, an i-type semiconductor, and an n-type semiconductor from a side of the substrate 1. The i-type semiconductor constitutes a power generation layer in the first semiconductor layer 3a. As the i-type semiconductor in the first semiconductor layer 3a, a semiconductor based on amorphous silicon such as a-Si or a-SiC can be used, for example. The first semiconductor layer 3a is filled into first separation grooves $H_i$.

The transparent electrically conductive layer 3b has transparency and electrical conductivity. The transparent electrically conductive layer 3b transmits a part of light which has been transmitted through the first semiconductor layer 3a to the side of the second semiconductor layer 3c, and reflects another part of light which has passed through the first semiconductor layer 3a to the side of the first semiconductor layer 3a at the same time. For the transparent electrically conductive layer 3b, a metal oxide such as ZnO, ITO, or $TiO_2$ can be used. The transparent electrically conductive layer 3b may be doped with a dopant such as Al.

The second semiconductor layer 3c generates photo-generated carriers with the light which is incident from the side of the transparent electrode layer 2, and which has been transmitted through the transparent electrode layer 2, the first semiconductor layer 3a, and the transparent electrically conductive layer 3b. The second semiconductor layer 3c has a pin junction (not shown) in which a p-type semiconductor, an i-type semiconductor, and an n-type semiconductor are stacked from the side of the transparent substrate 1. The i-type semiconductor constitutes a power generation layer in the second semiconductor layer 3c. As the i-type semiconductor layer in the second semiconductor layer 3c, a semiconductor based on microcrystalline silicon such as pc-Si or pc-Site can be used, for example.

(Method for Manufacturing Solar Cell Module)

Figure 7:
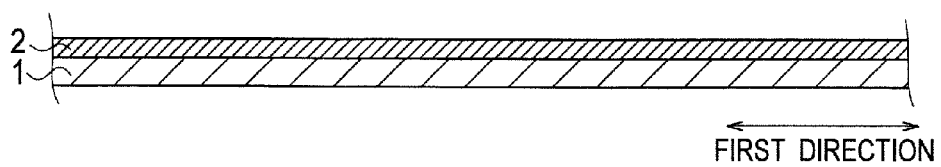
FIG. 7 is a view for describing the manufacturing process of the solar cell module 30 according to the second embodiment of the present invention (part 1).
Figure 7:
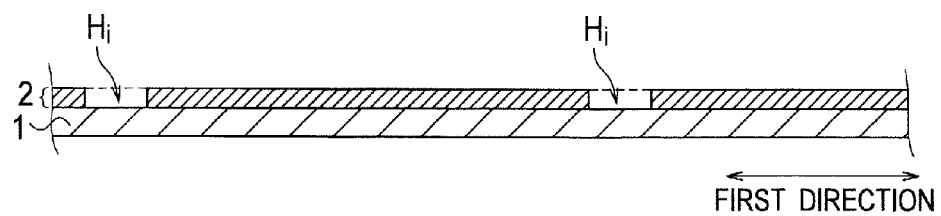
Figure 7:
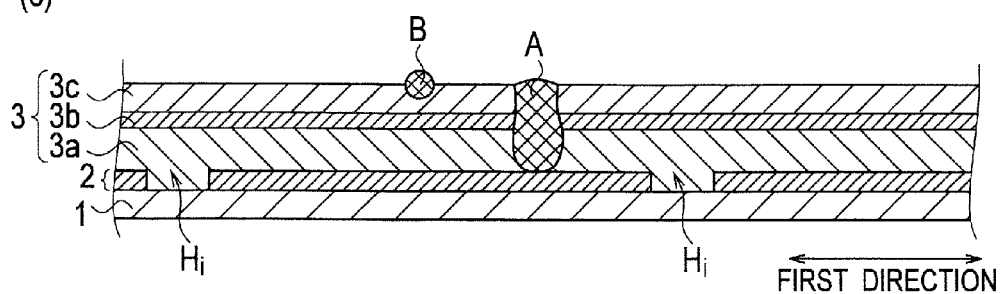
Figure 7:
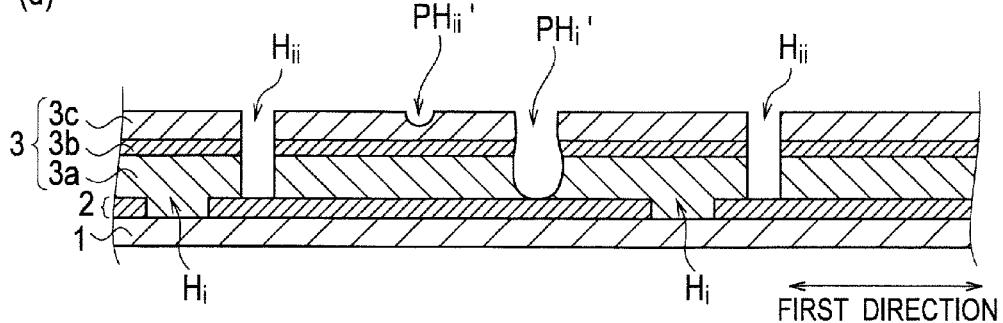
Figure 8:
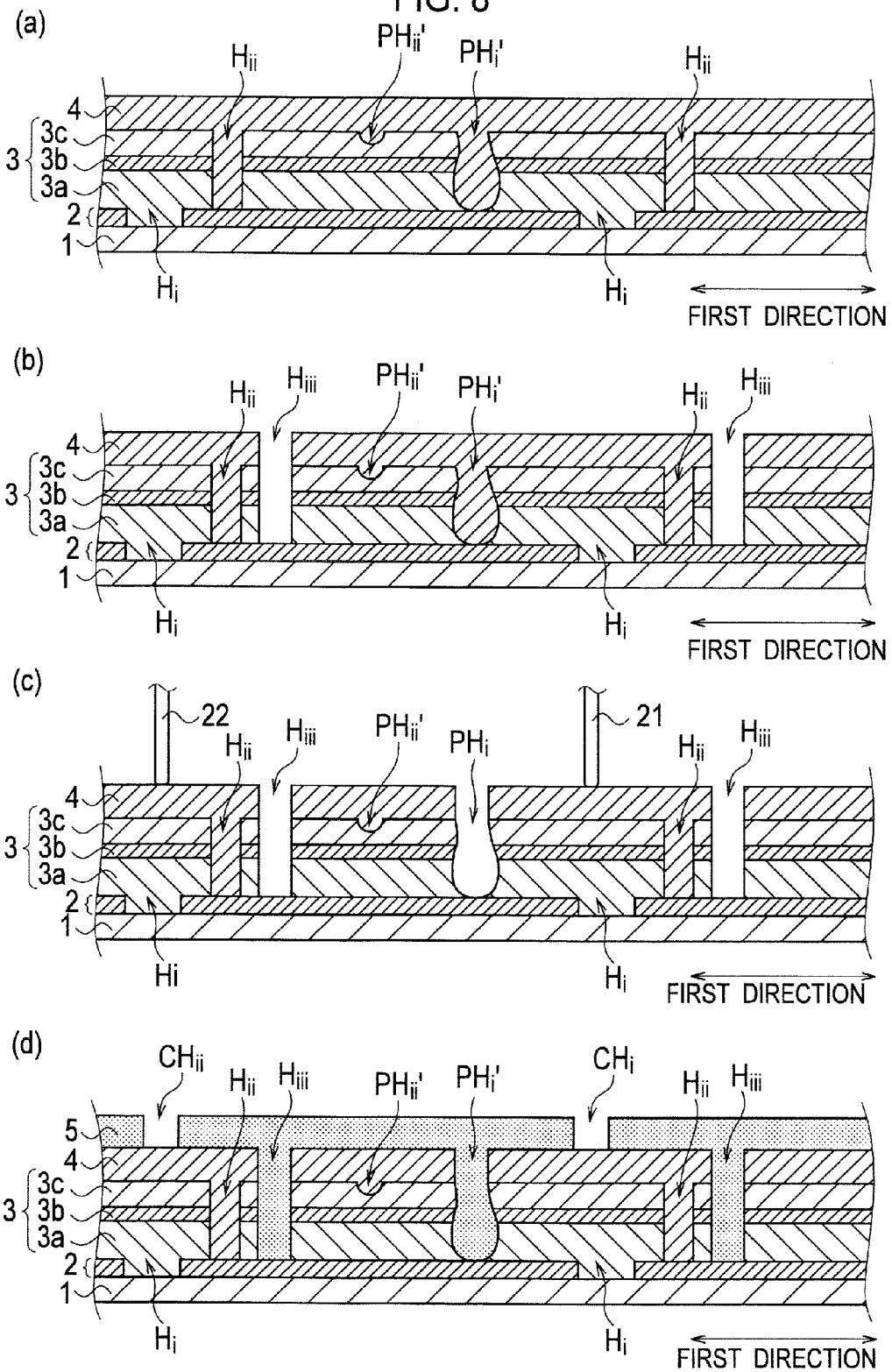
FIG. 8 is a view for describing the manufacturing process of the solar cell module 30 according to the second embodiment of the present invention (part 2).
Figure 9:
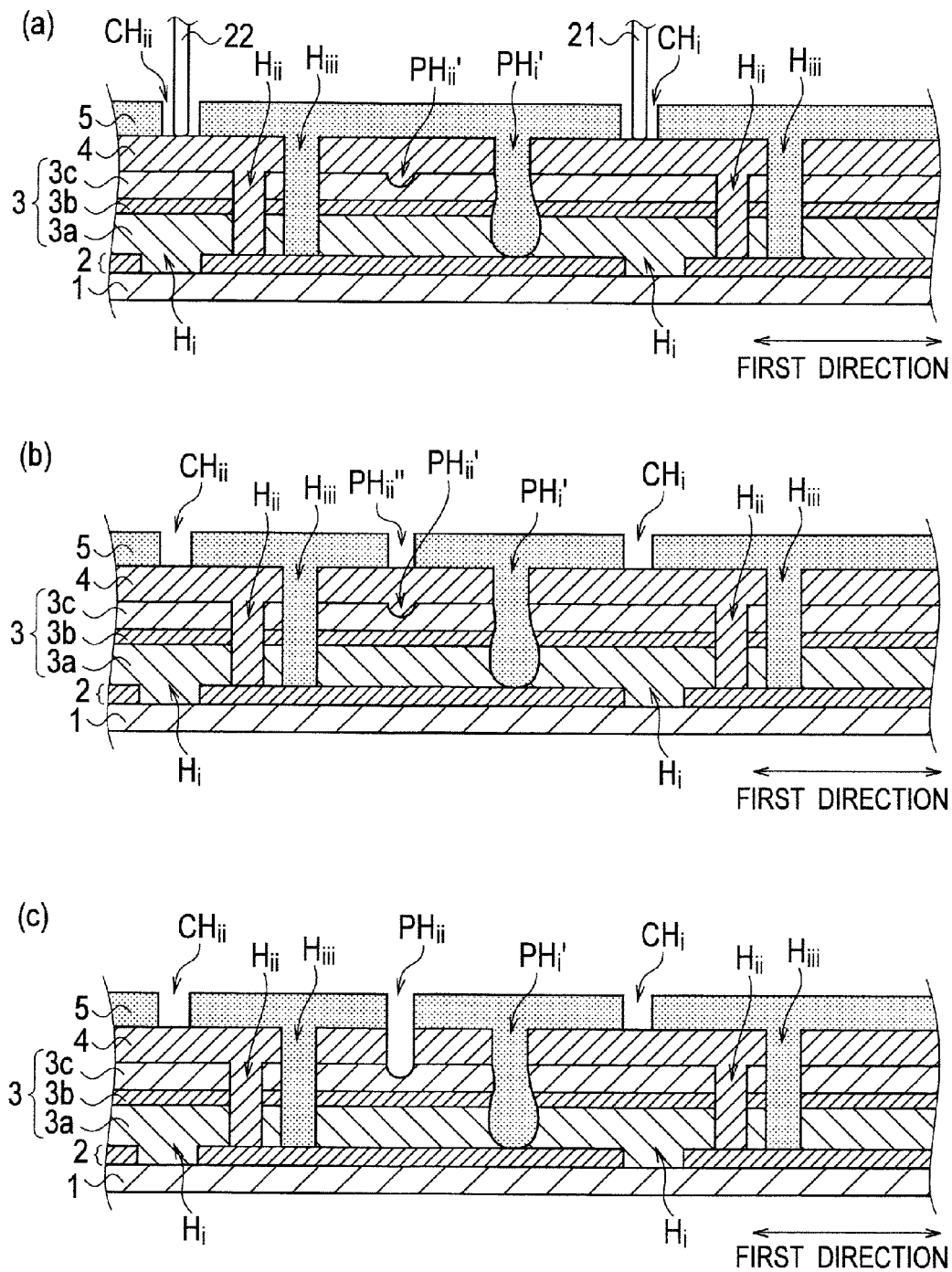
FIG. 9 is a view for describing the manufacturing process of the solar cell module 30 according to the second embodiment of the present invention (part 3).

Description will be made of a method for manufacturing the solar cell module 30 according to the second embodiment with reference to FIG. 7 to FIG. 9.

As shown in FIG. 7(a), the transparent electrode layer 2 is stacked on the main surface of the transparent substrate 1. By irradiating the stacked transparent electrode layer 2 with laser light, the transparent electrode layer 2 is removed in the second direction. This results in the formation of the first separation grooves $H_i$ which divides the transparent electrode layer 2 as shown in FIG. 7(b).

Next, the first semiconductor layer 3a, the transparent electrically conductive layer 3b, and the second semiconductor layer 3c are sequentially formed on the transparent electrode layer 2 by a RF plasma CVD method or the like, as shown in FIG. 7(c). This results in the formation of the semiconductor layer 3. The first semiconductor layer 3a and the second semiconductor layer 3c are formed by a plasma CVD method. The transparent electrically conductive layer 3b is formed by a sputtering method or the like.

By irradiating the formed semiconductor layer 3 with laser light, the semiconductor layer 3 is removed in the second direction. This results in the formation of the second separation grooves $H_{ii}$ which divide the semiconductor layer 3 as shown in FIG. 7(d). In this embodiment, when a foreign material A incorporated into the semiconductor layer 3 separates from the semiconductor layer 3, the pinhole $PH_i'$ is formed in the semiconductor layer 3, similarly to the above-described first embodiment.

During the formation of the second semiconductor layer 3c, a foreign material B may be attached onto the semiconductor layer 3 as shown in FIG. 7(c). When the foreign material B separates from the second semiconductor layer 3c, the pinhole $PH_{ii}'$ is formed in the second semiconductor layer 3c.

Next, as shown in FIG. 8(a), the metal electrode layer 4 is formed on the semiconductor layer 3, in the second separation grooves $H_{ii}$, and in the pinhole $PH_i'$. Subsequently, by irradiating the metal electrode layer 4 with laser light, the semiconductor layer 3 and the metal electrode layer 4 are removed in the second direction. This results in the formation of the third separation grooves $H_{iii}$ which divide both the semiconductor layer 3 and metal electrode layer 4, as shown in FIG. 8(b).

Next, a voltage in a direction opposite to a direction of a photo-electromotive force to be generated in the semiconductor layer 3 is applied across the transparent electrode layer 2 and the metal electrode layer 4. Specifically, a high potential is applied to the first electrode 21, and a low potential is applied to the second electrode 22, as shown in FIG. 8(c). In this reverse voltage repair process, the metal electrode layer 4 formed in the pinhole $PH_i'$ is heated and vaporizes. This results in the formation of the first pinhole $PH_i$ which penetrates through the semiconductor layer 3 and the metal electrode layer 4. Meanwhile, although the microscopic short circuit portion formed in the pinhole $PH_{ii}'$ is heated, the temperature of the microscopic short circuit portion formed in the pinhole $PH_{ii}'$ does not reach the vaporization temperature. Accordingly, the pinhole $PH_{ii}'$ is still covered with the metal electrode layer 4.

Next, the resin layer 5 is formed on the metal electrode layer 4, in the third separation grooves $H_{iii}$, and in the first pinhole $PH_i'$ as shown in FIG. 8(d). In this embodiment, the first contact hole CH$_i$ and the second contact hole CH$_{ii}$ are formed in the resin layer 5 similarly to the above-described first embodiment.

Next, the resin layer 5 is heated at approximately 100° C. for about 10 minutes, whereby the resin layer 5 is hardened.

Next, the first electrode 21 is inserted into the first contact hole CH$_i$ as shown in FIG. 9(a). The second electrode 22 is inserted into the second contact hole CH$_{ii}$. Subsequently, a reverse voltage is applied across the transparent electrode layer 2 and the metal electrode layer 4. In this reverse voltage repair process, the microscopic short circuit portion of the metal electrode layer 4 formed in the pinhole PH$_{ii}$' is heated to a temperature below the vaporization temperature. This heating causes a part of the resin layer 5 on the pinhole PH$_{ii}$' to vaporize. As shown in FIG. 9(b), the pinhole PH$_{ii}$" is formed above the pinhole PH$_{ii}$' of the resin layer 5. A part of the metal electrode layer 4 is exposed in the pinhole PH$_{ii}$".

Next, by etching the metal electrode layer 4 using the resin layer 5 as a mask, the metal electrode layer 4 exposed in the pinhole PH$_{ii}$" is removed as shown in FIG. 9(c). This results in the formation of the second pinhole PH$_{ii}$ which penetrates through the metal electrode layer 4 and the resin layer 5.

(Operation and Effects)

The method for manufacturing the solar cell module 30 according to the second embodiment of the present invention includes a reverse voltage repair process as a step prior to the step of forming the resin layer 5.

Accordingly, the resin layer 5 can be filled into the first pinhole PH$_i$ formed in the reverse voltage repair process. For this reason, water can be prevented from reaching the semiconductor layer 3 through the first pinhole PH$_i$. As a result, moisture-resistance of the solar cell module 30 can be improved. Polyethylene terephthalate (PET) or epoxy (EP) hardly allows water vapor to permeate, even in an environment with a high temperature and a high humidity. Accordingly, by using polyethylene terephthalate or epoxy is used as the resin layer 5, water can be further prevented from reaching the semiconductor layer 3. As a result, moisture-resistance of the solar cell module 30 can be further improved.

By suppression of degradation of the transparent electrically conductive layer 3b due to water, reliability of the solar cell module 30 can be improved.

Other Embodiments

The details of the present invention have been disclosed by using the above-described embodiments. However, it should not be understood that the description and drawings which constitute part of this disclosure limit the present invention. From this disclosure, various alternative embodiments, examples, and operation techniques will be easily found by those skilled in the art.

For example, the metal electrode layer is formed by use of an electrical conductive metal material such as silver in the above-described embodiments; however, the present invention is not limited thereto. As the metal electrode layer, a coated electrode also can be used. As a material for the coated electrode, a metal paste obtained by mixing any one kind or two or more kinds of silver particles, aluminum particles (Al), copper particles (Cu) with a resin can be used. This metal paste is coated onto a semiconductor layer. By burning the coated metal paste, the coated electrode is formed. Examples of the coating method include screen printing, a spin coating method, a spray coating method, and the like.

In the above-described embodiments, the semiconductor layer 3 is made to include a pin junction; however, the present invention is not limited thereto. The semiconductor layer 3 may include a pn junction formed of a p-type semiconductor and an n-type semiconductor.

In the above-described first embodiment, the semiconductor layer 3 is made to include one pin junction; however, the present invention is not limited thereto. The semiconductor layer 3 may include 2 or more pin junctions.

In the above-described second embodiment, the semiconductor layer 3 is made to include two pin junctions; however, the present invention is not limited thereto. The semiconductor layer 3 may include one, or three or more pin junctions.

In the above-described first embodiment, the semiconductor layer 3 is mainly composed of an amorphous silicon semiconductor; however, the present invention is not limited thereto. For example, the semiconductor layer 3 may be mainly composed of a crystalline silicon semiconductor. Note that the crystalline silicon includes microcrystalline silicon and polycrystalline silicon.

In the above-described second embodiment, the first semiconductor layer 3a is mainly composed of an amorphous silicon semiconductor; however, the present invention is not limited thereto. For example, the first semiconductor layer 3a may be mainly composed of a crystalline silicon semiconductor.

In the above-described second embodiment, the second semiconductor layer 3c is mainly composed of a microcrystalline silicon semiconductor; however, the present invention is not limited thereto. For example, the second semiconductor layer 3c may be mainly composed of an amorphous silicon semiconductor.

As described above, the present invention naturally includes various embodiments and the like which are not described herein. Accordingly, the technical scope of the present invention should be determined only by the matters to define the invention in the scope of claims regarded as appropriate based on the description.

EXAMPLES

Hereinafter, specific description will be made of a solar cell module according to the present invention, by way of Examples. However, the present invention is not limited to the following examples but can be carried out by making appropriate modifications without departing from the scope of the invention.

Example

A solar cell module according to Example was fabricated as follows.

A SnO$_2$ layer was formed on a glass substrate.

Next, a part of the SnO$_2$ layer was removed by irradiation with Nd:YAG laser light from the side of the SnO$_2$ layer. Thereby, first separation grooves which divide the SnO$_2$ layer were formed. As the Nd:YAG laser light, a fundamental wave with a wavelength of 1064 nm was used. In addition, the width of the first separation grooves was 40 μm.

Next, by use of a RF plasma CVD method, a p-type amorphous silicon semiconductor layer, an i-type amorphous silicon semiconductor layer, and an n-type amorphous silicon semiconductor layer were sequentially stacked on the SnO$_2$ layer. The thickness of the i-type amorphous silicon semiconductor was 300 nm.

Next, by use of a DC sputtering method, a ZnO layer containing Al as a dopant was formed on the n-type amorphous silicon semiconductor layer. The thickness of the ZnO layer was 50 nm.

Next, by use of a RF plasma CVD method, a p-type microcrystalline silicon semiconductor, an i-type microcrystalline silicon semiconductor, an n-type microcrystalline silicon semiconductor were sequentially stacked on the ZnO layer. The thickness of the i-type microcrystalline silicon semiconductor was 2000 nm.

Table 1 shows conditions for forming each of the semiconductor layer by the RF plasma CVD method.

TABLE 1

| | Layer | Substrate temperature (° C.) | Gas flow rate (sccm) | Reaction pressure (Pa) | RF power (W) | Film thickness (nm) |
|---|---|---|---|---|---|---|
| a-Si film | p-layer | 180 | $SiH_4$: 300<br>$CH_4$: 300<br>$H_2$: 2000<br>$B_2H_6$: 3 | 106 | 10 | 10 |
| | i-layer | 200 | $SiH_4$: 300<br>$H_2$: 2000 | 106 | 20 | 300 |
| | n-layer | 180 | $SiH_4$: 300<br>$H_2$: 2000<br>$PH_3$: 5 | 133 | 20 | 20 |
| Microcrystalline Si film | p-layer | 180 | $SiH_4$: 10<br>$H_2$: 2000<br>$B_2H_6$: 3 | 106 | 10 | 10 |
| | i-layer | 200 | $SiH_4$: 100<br>$H_2$: 2000 | 133 | 20 | 2000 |
| | n-layer | 200 | $SiH_4$: 10<br>$H_2$: 2000<br>$PH_3$: 5 | 133 | 20 | 20 |

Next, by irradiation with Nd:YAG laser light from the side of the glass substrate, a part of each of the semiconductor and ZnO layers was removed. Thereby, second separation grooves were formed. As the Nd:YAG laser light, a second harmonic wave with a wavelength of 532 nm was used. The width of each of the second separation grooves was 50 μm.

Next, by use of a DC sputtering method, a Ag layer was formed on the n-type microcrystalline silicon semiconductor. The thickness of the Ag layer was 200 nm.

Next, locations on sides which was opposite to the first separation grooves with respect to the second separation grooves were irradiated with Nd:YAG laser light from the side of the glass substrate. Thereby, a part of each of the Ag, each semiconductor layer, and ZnO layers was removed. As a result, third separation grooves were formed. As the Nd:YAG laser light, a second harmonic wave with a wavelength of 532 nm was used. In addition, the width of each of the third separation grooves was 50 μm.

Next, an acrylic resin dissolved in an organic solvent was coated onto the Ag layer by a spray method. Thereby, an acrylic resin layer having a thickness of approximately 15 μm was formed. At that time, a pair of contact holes into which a pair of electrode was inserted were formed by use of a mask.

Next, voltage was applied across the $SnO_2$ layer and the Ag layer, so that a 6 V reverse voltage was applied to each of the divided sections of the semiconductor layers in a direction opposite to the direction of a photo-electromotive force to be generated in the divided section of the semiconductor layers. Thereby, a part of the acrylic resin layer was vaporized, and a pinhole which penetrated through the acrylic resin layer was formed. A part of the Ag layer was exposed in the pinhole.

Next, the Ag layer exposed in the pinhole was etched with a 5% aqueous solution of hydrochloric acid for about 3 minutes. Thereby, a pinhole which penetrated through the Ag layer and the acrylic resin layer was formed.

Comparative Example 1

A solar cell module according to Comparative Example 1 was fabricated. Comparative Example 1 differs form the above-described Example in that steps after the step of forming the acrylic resin layer were not conducted. Specifically, no reverse voltage repair process was conducted in Comparative Example 1. The other steps were the same as those in Example.

Comparative Example 2

A solar cell module according to Comparative Example 2 was fabricated. Comparative Example 2 differs from the above-described Example in that neither the step of forming the acrylic resin layer nor the etching step was conducted, and a generally employed reverse voltage repair process was conducted. The other steps were the same as the above-described first embodiment.

<Evaluation of Output Characteristics>

Next, the solar cell modules according to Example, Comparative Example 1, and Comparative Example 2 were compared with each other in terms of open circuit voltage Voc, short circuit current Isc, fill factor F.F., and output value Pmax.

Table 2 shows the results of the comparison.

TABLE 2

| | Voc (V) | Isc (A) | F. F. | Pmax (W) |
|---|---|---|---|---|
| Example | 76.5 | 1.200 | 0.735 | 67.74 |
| Comparative Example 1 | 74.7 | 1.145 | 0.571 | 48.83 |
| Comparative Example 2 | 75.8 | 1.172 | 0.683 | 60.67 |

As shown in Table 2, the value of each of the characteristics of the solar cell module according to Example was better than the value of the corresponding characteristic of the solar cell modules according to Comparative Example 1 and Comparative Example 2.

This is because a part of the Ag layer which would have otherwise caused a microscopic short circuit was successfully removed by etching of the Ag layer exposed in the pinhole. Accordingly, it was found that the method for manufacturing the solar cell module according to Example makes it possible to improve characteristics of a solar cell module by removing such a microscopic short circuit.

On the other hand, for the solar cell module according to Comparative Example 2, only the generally employed reverse voltage repair process was conducted. Hence, the microscopic short circuit failed to be removed. For this reason, the obtained values of the characteristics were lower than those of the solar cell module according to Example.

For the solar cell module according to Comparative Example 1, even the generally employed reverse voltage repair process was not performed. Hence, not only microscopic short circuits, but also short circuits which can be removed by the generally employed reverse voltage repair process were not removed. As a result, the obtained values of the characteristics were lower than those of the solar cell modules according to Example and Comparative Example 2.

Note that the entire content of Japanese Patent Application No. 2008-231321 (filed on Sep. 9, 2008) is incorporated herein by reference.

INDUSTRIAL APPLICABILITY

As described above, a method for manufacturing a solar cell module according to the present invention can provide a solar cell module capable of suppressing the occurrence of a microscopic short circuit between a transparent electrode and a metal electrode. Therefore, the method for manufacturing a solar cell module according to the present invention is useful for manufacturing a solar cell module.

EXPLANATION OF REFERENCE NUMERALS

1 . . . transparent substrate, 2 . . . transparent electrode layer, 3 . . . semiconductor layer, 3*a* . . . first semiconductor layer, 3*b* . . . transparent electrically conductive layer, 3*c* . . . second semiconductor layer, 4 . . . metal electrode layer, 5 . . . resin layer, 6 . . . sealing member, 7 . . . back-surface-side protection member, 8 . . . elastic member, 9 . . . frame, 21 . . . first electrode, 22 . . . second electrode, 10, 30 . . . solar cell module, A, B . . . foreign material, $H_i$ . . . first separation groove, $H_{ii}$ . . . second separation groove, $H_{iii}$ . . . third separation groove

The invention claimed is:

1. A method for manufacturing a solar cell module, comprising the steps of:
    sequentially forming a transparent electrode layer, a semiconductor layer, and a metal electrode layer on a main surface of a transparent substrate;
    forming a separation groove at least dividing the metal electrode layer on the transparent electrode layer;
    forming a resin layer on the metal electrode layer and in the separation groove;
    exposing a part of the metal electrode layer in a pinhole which is formed in the resin layer by applying a voltage across the transparent electrode layer and the metal electrode layer in a direction opposite to a direction of a photo-electromotive force to be generated in the semiconductor layer; and
    removing the part of the metal electrode layer by etching the part of the metal electrode layer using the resin layer as a mask.

2. A method for manufacturing a solar cell module, comprising the steps of:
    sequentially forming a transparent electrode layer, a semiconductor layer, and a metal electrode layer on a main surface of a transparent substrate;
    forming a first pinhole in the metal electrode layer by applying a voltage across the transparent electrode layer and the metal electrode layer in a direction opposite to a direction of a photo-electromotive force to be generated in the semiconductor layer;
    forming a resin layer on the metal electrode layer and in the first pinhole;
    exposing a part of the metal electrode layer in a second pinhole which is formed in the resin layer by applying the reverse voltage across the transparent electrode layer and the metal electrode layer; and
    removing the part of the metal electrode layer by etching the part of the metal electrode layer using the resin layer as a mask.

3. The method for manufacturing a solar cell module according to claim 2, wherein
    the semiconductor layer has a first semiconductor layer, a transparent electrically conductive layer, and a second semiconductor layer which are sequentially formed on the transparent electrode, and
    in the step of forming the first pinhole, the first pinhole penetrates through at least the metal electrode layer and the second semiconductor layer.

* * * * *